(12) United States Patent
Grosser et al.

(10) Patent No.: US 7,791,356 B2
(45) Date of Patent: Sep. 7, 2010

(54) CAPACITIVE PROXIMITY SWITCH AND HOUSEHOLD APPLIANCE EQUIPPED THEREWITH

(75) Inventors: Jörg Grosser, Bad Abbach (DE); Wilfried Klopfer, Regensburg (DE); Bernward Reinker, Regenstauf (DE); Hans-Jürgen Romanowski, Bernhardswald (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 338 days.

(21) Appl. No.: 12/065,393

(22) PCT Filed: Aug. 17, 2006

(86) PCT No.: PCT/EP2006/065392
§ 371 (c)(1),
(2), (4) Date: Mar. 26, 2008

(87) PCT Pub. No.: WO2007/025867
PCT Pub. Date: Mar. 8, 2007

(65) Prior Publication Data
US 2008/0246494 A1    Oct. 9, 2008

(30) Foreign Application Priority Data
Aug. 30, 2005    (DE) .................. 10 2005 041 111

(51) Int. Cl.
*G01R 27/26*    (2006.01)
(52) U.S. Cl. ........................... 324/662; 324/690
(58) Field of Classification Search ................ 324/658, 324/662, 686, 690; 327/517
See application file for complete search history.

(56) References Cited

U.S. PATENT DOCUMENTS

| 4,918,376 A | * | 4/1990 | Poduje et al. | ............... 324/663 |
| 7,010,958 B2 | * | 3/2006 | Gajdeczko et al. | ........... 73/37.5 |

\* cited by examiner

*Primary Examiner*—Vincent Q Nguyen
(74) *Attorney, Agent, or Firm*—Laurence A. Greenberg; Werner H. Stemer; Ralph E. Locher

(57) ABSTRACT

A capacitive proximity switch has an electrically conductive sensor surface, which is covered by an electrically non-conductive covering plate and which serves as a part of a capacitor with a capacitance that varies with proximity. The proximity switch includes a reference sensor surface for generating a reference signal for determining an actuation state of the proximity switch. Signal portions of the reference signal are proportional to the capacitance of a reference capacitor formed with the reference sensor surface, and the capacitance of the reference capacitor is determined by surrounding conditions of the sensor surface.

11 Claims, 8 Drawing Sheets

CAPACITIVE PROXIMITY SWITCH AND HOUSEHOLD APPLIANCE EQUIPPED THEREWITH

BACKGROUND OF THE INVENTION

Field of the Invention

The invention relates to a capacitive proximity switch with an electrically conductive sensor surface, which is covered by an electrically insulating cover plate, and which serves as a part of a capacitor with a capacitance that varies with proximity.

Numerous devices with capacitive sensors or switches are already known. The present invention relates to a specific design of capacitively acting switch, in which an electrically conductive sensor surface is covered by an electrically insulating cover plate. A user does not touch the sensor surface directly, therefore, but instead just approaches it when touching the cover plate. The sensor surface forms a plate of an open-type capacitor, the capacitance of which is dependent on the distance from a second plate (e.g. ground), which distance is altered by the proximity of a finger of the user for example.

A capacitive proximity switch of this type is already known from DE 695 19 701 T2. This provides a semiconductor switch, the signal input of which is supplied with an input signal in the form of a train of polarized pulses and which in the idle state, i.e. whenever the proximity switch is not being actuated, is in a blocking state, so that no output signal is present at the signal output of the semiconductor switch. However, a proximity switch of this type has the disadvantage that reliable detection of an actuation by the user cannot be ensured due to aging processes or changes in the ambient conditions.

BRIEF SUMMARY OF THE INVENTION

The object underlying the present invention is therefore to make an improved, low-cost capacitive proximity switch available.

According to the invention, the object indicated in the foregoing is achieved in the case of a capacitive proximity switch of the type referred to in the introduction by the fact that the proximity switch has a reference sensor surface for generating a reference signal for determining an actuation state of the proximity switch, signal components of the reference signal being proportional to the capacitance of a reference capacitor formed with the reference sensor surface, and the capacitance of the reference capacitor being determined by ambient conditions of the sensor surface. This brings with it the advantage that the influence of ambient conditions such as for example humidity, temperature, or increases and decreases in temperature over time, but also the influence of changes in materials due to aging, on the output signal of the sensor surface is determined by the reference signal and can be taken into account in the evaluation of the output signal, which is proportional to the capacitance of the capacitor formed with the sensor surface. A further advantage consists in the fact that in the case of appliances that are switched on with a power switch, it is possible to establish by means of the reference signal as early as during switching on whether there is an actuation of the proximity switch. Overall, plausibility queries in the evaluation of the output signal can be reduced by means of the reference signal.

Preferably, the reference sensor surface and the sensor surface are arranged on a common substrate, in particular on the same side of the substrate. The spatial vicinity of the reference sensor surface to the sensor surface ensures that the reference signal represents the parasitic capacitances of the sensor surface.

In accordance with a preferred embodiment, the substrate is arranged at a distance from the cover plate and an electrically conductive body is arranged between the cover plate and the substrate, which body spans the distance and which is connected to the sensor surface in an electrically conductive manner, and/or which forms one part of the sensor surface with at least one part of its surface. The electrically conductive body causes the sensor-related detector property of the sensor surface to be displaced from the substrate to the rear side of the cover plate. The reference sensor surface is insulated by means of the air layer between the substrate and the cover plate against changes in charge at the front side of the cover plate, in particular in the case of touching by a user, so that an intentional or unintentional actuation of the reference sensor surface by the user is prevented.

A clock signal is beneficially present at the sensor surface and a further clock signal or the same clock signal at the reference sensor surface. By this means, the capacitance of the reference sensor surface can be determined similarly to the capacitance of the capacitor formed with the sensor surface, and the reference signal can be processed similarly to its output signal. Advantageously, the clock signal, which is output in particular from an output, e.g. an analog output or a digital output of a microprocessor, is a periodic clock signal, in particular a square-wave signal, and has a frequency preferably in the range from 10 to 100 kilohertz. As a result, a sufficient interrogation frequency of the capacitance of the capacitor formed with the sensor surface is ensured for the purposes of detecting an actuation of the proximity switch. Moreover, it is possible to do without a costly separate frequency generator for generating the clock signal, which reduces the number of components necessary.

Preferably, the clock signal is present at the sensor surface and at the reference sensor surface in a time-division multiplex method. The high frequency of the clock signal ensures a sufficient interrogation frequency of the capacitances of the capacitor formed with the sensor surface and of the reference capacitor for the purposes of detecting an actuation of the proximity switch. The use of only one clock signal has the advantage that only one clock signal generator is needed. The reference signal is taken into account in a simple manner by means of a software program of the microprocessor during the determination of an actuation state of the proximity switch.

In the preferred embodiment, in which the substrate is arranged at a distance from the cover plate and an electrically conductive body is arranged between the cover plate and the substrate, which body spans the distance and which is connected to the sensor surface in an electrically conductive manner, and/or which forms at least one part of the sensor surface with at least one part of its surface, it has proved particularly favorable to arrange at least one electronic component on the substrate in such a way that it protrudes into a cavity which is enclosed by the electrically conductive body. Together with a screening surface arranged on the rear side of the printed circuit board in particular, the electrically conductive body, which comprises in particular a compression spring wound out of a stretched body, forms a type of Faraday cage for the electronic component so that the said component is screened against electromagnetic interference signals from the environment.

Preferably, by this means, the semiconductor switch is arranged on the substrate and screened against electromagnetic interference signals so that the quality of the output signal is improved.

Advantageously, a light-emitting element, such as an LED for example, an incandescent lamp or a light guide, is arranged on the substrate, protruding into the cavity enclosed by the electrically conductive body and/or within an area defined by the sensor surface. Said light-emitting element can be used for identifying the sensor surface or for indicating various switching states of the proximity switch. Furthermore, a marking, e.g. in the form of an imprint, can be applied on the upper side of the cover plate or, in the case of a transparent cover plate, on its lower side for the purposes of identifying the position of the sensor surface.

Preferably, a household appliance, such as for example a washing machine, a laundry dryer, a dishwasher, a cooking appliance, a fume extractor hood, a refrigeration appliance, an air-conditioning appliance, a water-heater or a vacuum cleaner, or an input field for a household appliance, is equipped with at least one proximity switch according to the invention. The household appliance can therefore be equipped with a continuous panel encompassing the input field so that the household appliance is protected against an ingress of contamination or humidity. In this respect the panel corresponds to the electrically insulating cover plate and can be manufactured out of glass, glass ceramic, ceramic, plastic, wood or stone for example. Furthermore, the proximity switch according to the invention ensures the appliance's safety since the household appliance is automatically switched off if the operational integrity of the proximity switch is no longer certain.

In accordance with a preferred embodiment, the input field has a plurality of sensor surfaces which are wired in a matrix shape for operating in a multiplex method. Furthermore, the input field can have one or more reference sensor surfaces. The high frequency of the clock signal ensures a sufficient interrogation frequency of the capacitances of the capacitors formed with the sensor surfaces and moreover of the reference capacitors for the purposes of determining an actuation by a user. The use of only one clock signal has the advantage that only one clock signal generator is needed.

In a further embodiment, at least two sensor surfaces are arranged adjacent to each other, in particular on the rear side of the cover plate or on a common substrate, and together form a position sensor. Depending on the position relative to the sensor surfaces at which an actuation by the user is detected due to the output signals associated with the sensor surfaces, different switching states can be triggered. By this means, a sliding switch can be formed without elements that have to be shifted mechanically, by the user stroking an area of the cover plate or the panel, which area is allocated to the position sensor, with a finger for example.

Reference is made to the fact that the features of the dependent claims can be combined with one another in any desired way without diverging from the idea according to the invention.

The invention is explained in more detail below with reference to drawings, in which:

DESCRIPTION OF THE INVENTION

Figure 1:
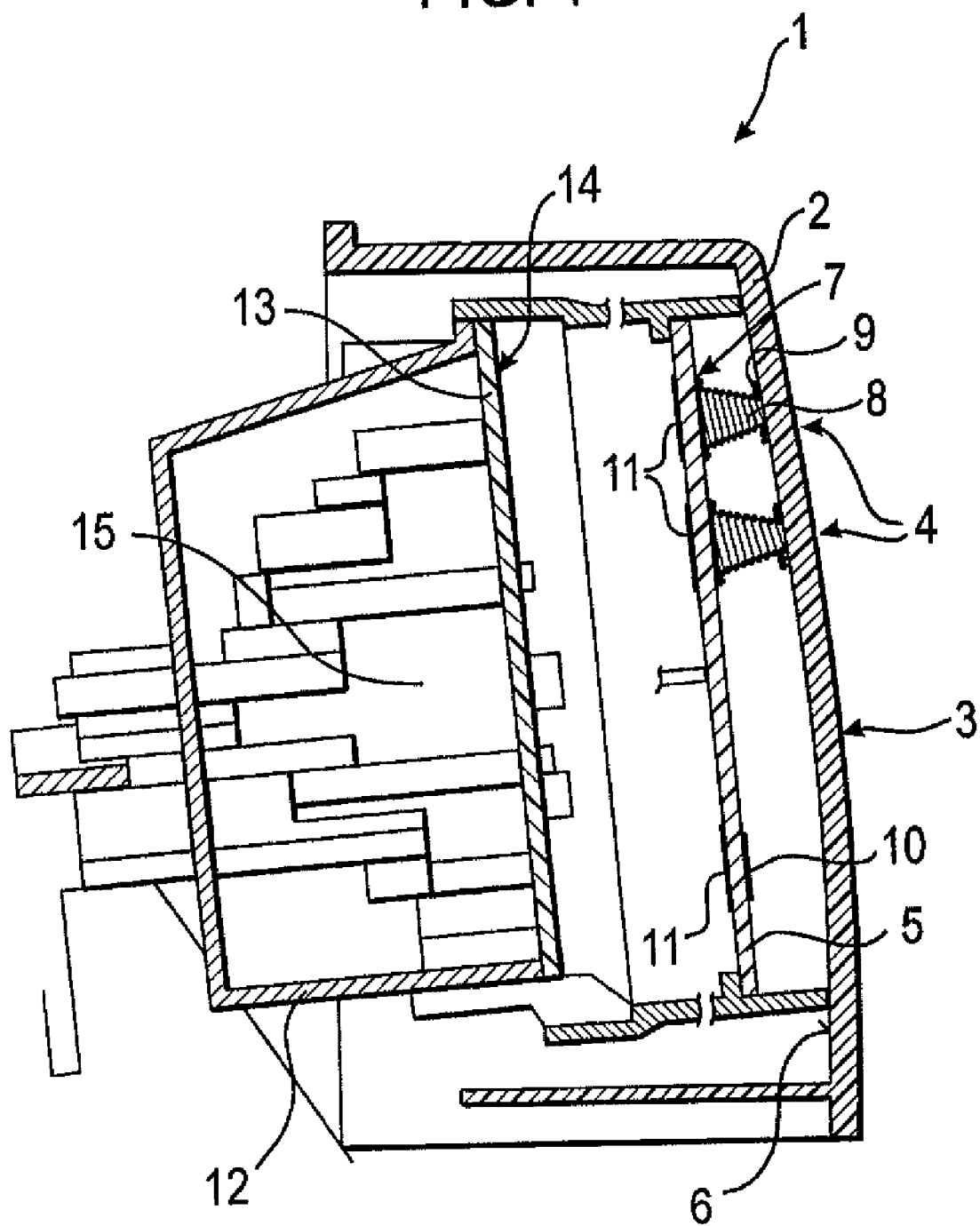
FIG. 1 shows, in a schematic sectional view, a section of a household appliance with a panel that has an input field according to the invention.

Prior to examining the drawings in further detail, it should be noted that corresponding or identical elements or individual parts are designated by the same reference symbols in all the drawing figures in the case of the various embodiments of the capacitive proximity switch according to the invention. If a plurality of elements or individual parts of the same type are used in a drawing, which elements or parts are referred to differently, the same number(s) is selected in each case for the leading place(s) of the corresponding reference symbols. The subsequent places of the corresponding reference symbols are used to differentiate the elements or individual parts of the same type.

A section of a household appliance 1 with a panel 2 that has an input field 3 according to the invention is shown in a schematic sectional view in FIG. 1. The panel 2 is embodied as an electrically insulating cover plate made out of a dielectric material such as glass, glass ceramic, ceramic, plastic, wood or stone for example. The input field 3 contains a plurality of identically constructed capacitive proximity switches 4, only two of which are shown here and just one of which is described in the following. At a distance from the panel 2, a printed circuit board 5 is arranged with an electrically conductive sensor surface 7 facing the rear side 6 of the panel 2. The printed circuit board 5 can comprise a plastic plate that has, on at least one of its sides, the aforementioned sensor surface 7 and where relevant conductor tracks by way of which the sensor surface 7 is connected in an electrically conductive manner to an electrical circuit 14 of the proximity switch 4 (see FIGS. 4, 5, and 6). The electrically conductive layer of the sensor surface 7 can be realized in various shapes, for example round or angular, with a continuous surface, grid-shaped or frame-shaped.

An electrically conductive body in the form of a wound compression spring 8, which is preferably embodied out of spring wire, is arranged between the panel 2 and the printed circuit board 5. At its upper end, the compression spring 8 has a flat winding disk 9 that consists of a plurality of windings, which, due to a compressive stress to which the compression spring 8 is subjected, lie within each other in a spiral shape and are matched in a form-fitting manner to the slightly convex shape of the rear side 6 of the panel 2. At its lower end, the compression spring 8 has a lower winding 9' with which it lies flat against the sensor surface 7 of the printed circuit board 5 and is soldered or bonded for example to the sensor surface 7 of the printed circuit board 5 at that point, or with which it just lies firmly under compressive stress against the sensor surface 7 of the printed circuit board 5 so that an electrically conductive connection exists between the compression spring 8 and the sensor surface 7 of the printed circuit board 5. This electrically conductive connection displaces the sensor-related detector property of the sensor surface 7 of the printed circuit board 5 to the rear side 6 of the panel 2 and the compression spring 8 for its part then forms at least one part of the sensor surface 7, in particular with its winding disk 9, 9'. In place of a wound, metal compression spring 8, the electrically conductive body can also have other shapes such as cylinder-shaped, cone-shaped or block-shaped for example, and/or be embodied out of other electrically conducive materials such as an electrically conductive plastic or a plastic with a metal core for example.

An electrically conductive reference sensor surface 10 is arranged on the same side of the printed circuit board 5 as that on which the sensor surface 7 is located, that is to say on the front side of the printed circuit board 5 facing the rear side 6 of the panel 2. Like the sensor surface 7, the reference sensor surface 10 is connected in an electrically conductive manner to the circuit 14 of the proximity switch 4. An associated reference sensor surface 10 can be provided for each of the sensor surfaces 7 or one common reference sensor surface 10 for a plurality of, or all of, the sensor surfaces 7. In contrast to the sensor surface 7, the electrically conductive compression spring 8 is absent in the case of the reference sensor surface 10 so that the reference sensor surface 10 is electrically insulated against electrical charges or, as the case may be, changes in charge, at the front side of the panel 2, by means of the air layer between the printed circuit board 5 and the panel 2.

Figure 2:
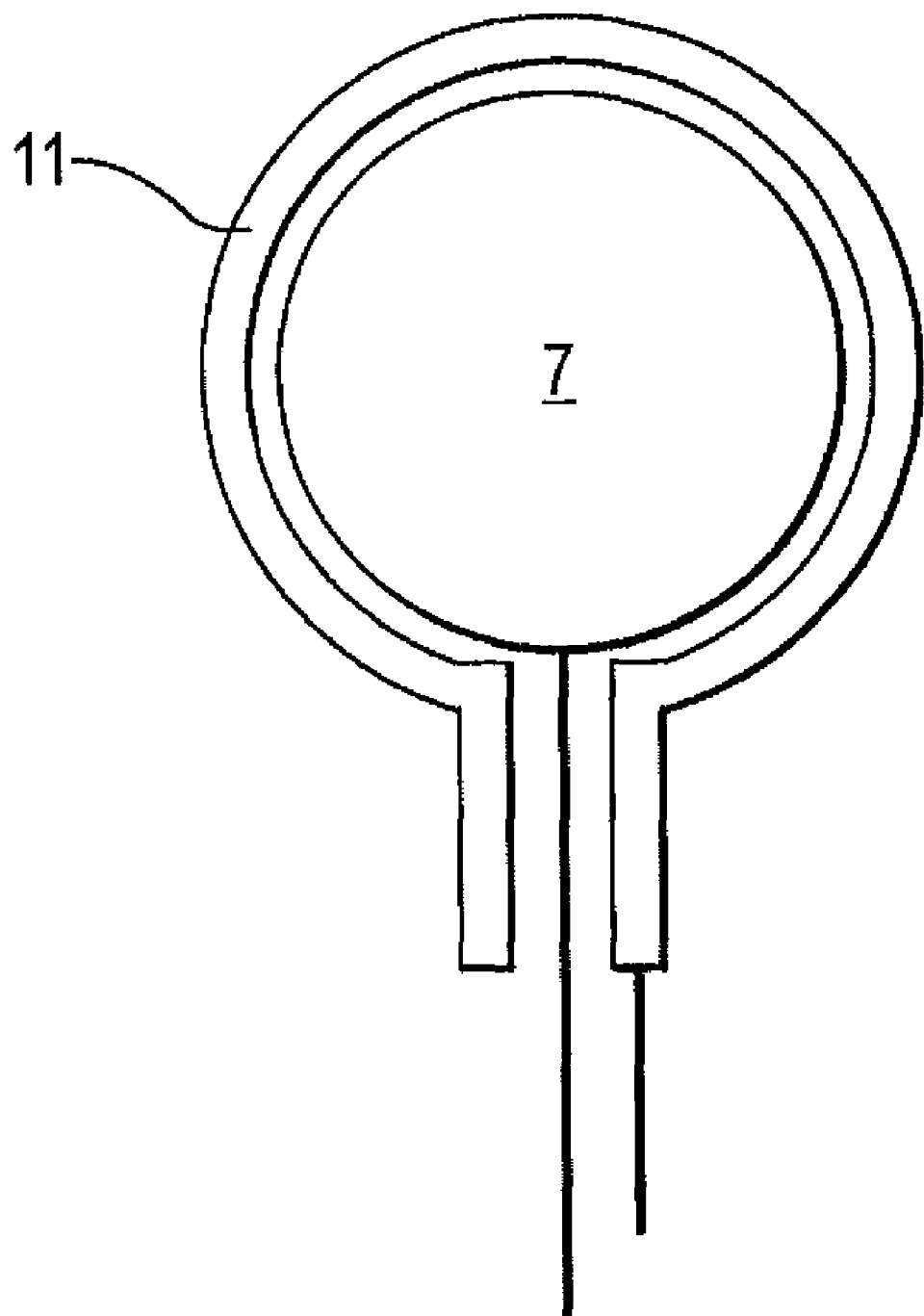
FIG. 2 shows, in a schematic front view, an embodiment of a sensor surface with a screening surface bordering the sensor surface.

On the rear side of the printed circuit board 5, an electrically conductive screening surface 11 is arranged in each case at the position of the sensor surface 7 or the reference sensor surface 10 respectively, the mode of operation of which screening surface is described further below in FIG. 5. In place of individual screening surfaces 11 for each sensor surface 7 or reference sensor surface 10, a single screening surface can be provided that extends over the entire rear side of the printed circuit board 5 or that at least covers the area on the rear side of the printed circuit board 5 that encompasses the sensor surfaces 7 or the reference sensor surface 10. In particular, the printed circuit board 5 can comprise a flexible printed circuit board or a copper-clad plastic film. In a further alternative embodiment, which is shown in FIG. 2, the sensor surface 7, which is implemented with a round shape in this case, and the screening surface 11 are both located on the front side of the printed circuit board 5. The screening surface 11 is formed in this case by an electrically conductive layer which encloses the sensor surface 7 in a frame shape, the shape of this frame being matched to the outer contour of the sensor surface 7.

The electrical circuit 14 of the proximity switch 4 can be arranged on the front side or rear side of the printed circuit board 5 or on a separate printed wiring board. Furthermore, a common circuit 14 can be provided for a plurality of, or all of, the proximity switches 4. In the embodiment shown in FIG. 1, an electronic module 12 is arranged in the rear area of the printed circuit board 5, which module has a printed wiring board 13 that has the circuit 14 of the proximity switch 4 on its front side facing the printed circuit board 5 and that is populated with power electronics 15 of the household appliance 1 on its rear side. This printed wiring board 13 is connected in an electrically conductive manner to the printed circuit board 5 (not shown).

Figure 3A:
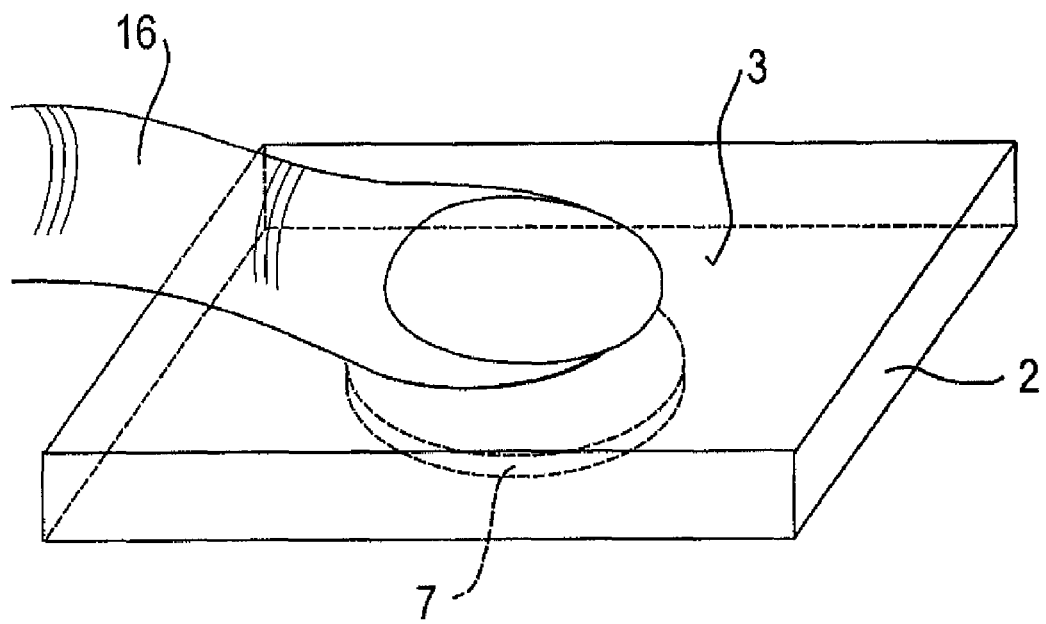
FIG. 3a, 3b show, in schematic form, a section of the input field as shown in FIG. 1 with an actuation of a capacitive proximity sensor according to the invention by a user.
Figure 3B:
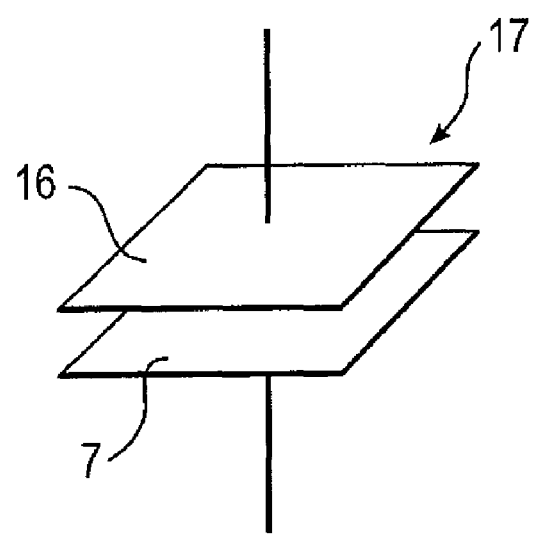

If, as shown in FIG. 3a, an element such as a finger 16 of a user for example, which element or which finger carries a potential that is different from the potential of the sensor surface 7, in particular ground potential, is then moved toward a surface area of the panel 2, which area is situated opposite the sensor surface 7, and/or brought into contact with the said area, then as a result a change in capacitance of a capacitor 17 consisting of the relevant element or the finger 16, the panel 2, and the sensor surface 7 or the sensor surface 7 together with the compression spring 8 is brought about (cf. FIG. 3b). Since the sensor surface 7 is connected in an electrically conductive manner to the circuit 14 of the proximity switch 4, the change in capacitance can be ascertained by means of the circuit 14 and evaluated further for the purposes of triggering a switching signal, as described further below. Furthermore, a light source 35 (cf. FIG. 8), such as an LED for example, can be provided on the printed circuit board 5 in the area within the compression spring 8 in order to identify the sensor surface 7 or signal different switching states of the proximity switch 4.

Figure 4:
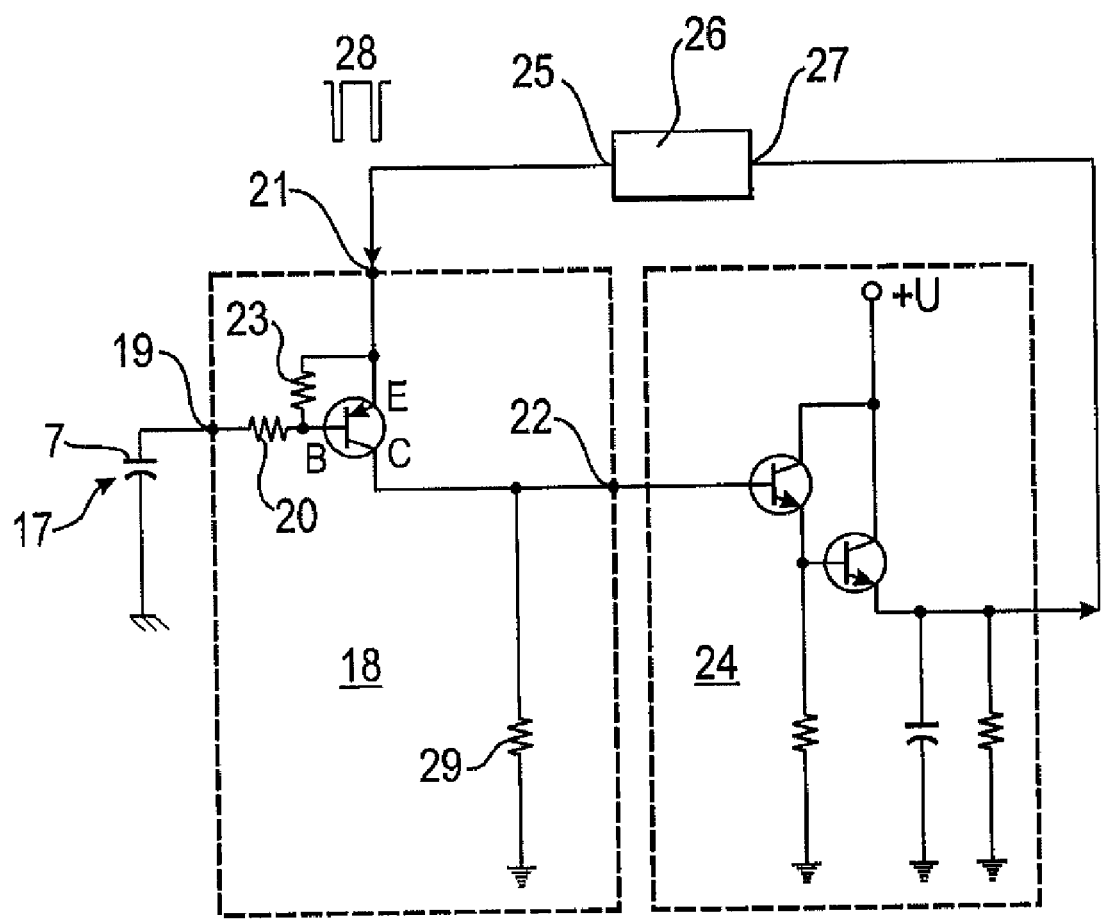
FIG. 4 shows a section of a schematic electrical circuit of the capacitive proximity switch according to the invention.

A section of a circuit diagram of the electrical circuit 14 is shown in FIG. 4. The circuit 14 has a PNP bipolar transistor as a semiconductor switch 18, to the control input 19 of which, that is to say to the base of which, the sensor surface 7 is connected by way of a current-limiting resistor 20. Moreover, the semiconductor switch 18 has a signal input 21, i.e. the emitter of the PNP bipolar transistor, and a signal output 22, i.e. the collector of the PNP bipolar transistor, the signal input 21 being connected to the sensor surface 7 by way of a base-emitter resistor 23. The current-limiting resistor 20 and the base-emitter resistor 23 can be implemented as being already integrated within the PNP bipolar transistor. The signal output 22 of the semiconductor switch 18 is connected, for the purposes of further processing of an output signal, to a sample and hold stage 24 of a known type, by means of which a dc voltage signal that is proportional to the amplitude of the pulse peaks of the output signal can be made available, and which sample and hold stage is not described further here. As an alternative to the sample and hold stage 24, the signal output 22 of the semiconductor switch 18 can be connected, for the purposes of processing the output signal, to a known integrator circuit or a known peak-reading voltmeter (not shown). The signal input 21 of the semiconductor switch 18 is connected to an analog signal output 25 of a microprocessor 26 and the signal output 22 of the semiconductor switch 18 is connected, by way of the sample and hold stage 24, to an analog signal input 27 of the microprocessor 26. In place of the one microprocessor 26, two different microprocessors can also be used, one of which is connected to the signal input 21 of the semiconductor switch 18 and the other to the signal output 22 of the semiconductor switch 18. In place of the PNP bipolar transistor, other semiconductor switches 18 can also be used, such as an NPN bipolar transistor, field-effect transistors or generally any controllable semiconductor elements for example.

A clock signal 28 is present at the signal input 21 of the semiconductor switch 18, which signal is made available by the analog signal output 25 of the microprocessor 26 for example. The clock signal 28 is a square-wave, periodic voltage signal, which is switched regularly by the microprocessor 26 between ground potential, i.e. LOW level, and the operating voltage of the circuit 14 of the proximity switch 4, i.e. HIGH level, it being possible for the ground potential to be different from the ground potential of the user. The clock frequency of the clock signal 28 preferably lies in the range between 10 and 100 kilohertz. The signal output 22 of the semiconductor switch 18, that is to say the collector of the PNP bipolar transistor, lies, by way of a further resistor 29, at the reference potential of the sample and hold stage 24. With the LOW level of the clock signal 28, the signal input 21 of the semiconductor switch 18, and therefore the emitter E of the PNP bipolar transistor and also the base-emitter resistor 23, is set to ground potential. This results in the sensor surface 7 or the capacitor 17 being discharged by way of the current-limiting resistor 20 and the base-emitter resistor 23. As a result, the base B of the PNP bipolar transistor becomes positive with respect to the emitter E of the PNP bipolar transistor and the PNP bipolar transistor blocks the current flow. With the HIGH level of the clock signal 28, following after the LOW level, the sensor surface 7, and therefore the capacitor 17, is charged up by way of the base-emitter resistor 23 and the current-limiting resistor 20. During this charge-up time of the sensor surface 7 or the capacitor 17 there is a voltage drop at the base-emitter resistor 23. As a result, the base B of the PNP bipolar transistor becomes negative with respect to the emitter E and the PNP bipolar transistor becomes conducting and connects through until the sensor surface 7 or the capacitor 17 is charged up to the HIGH level of the clock signal 28. During this charge-up time of the sensor surface 7 or the capacitor 17 by the clock signal 28, an output signal is present at the resistor 29 that is proportional to the capacitance of the sensor surface 7 or the capacitor 17. Thus, there is present at the signal output 22 of the semiconductor switch 18 an output signal which follows the clock signal 28 and the signal components of which are proportional to the capacitance of the sensor surface 7 or the capacitor 17.

This output signal is converted into a dc voltage signal by means of the sample and hold stage and is present at the analog signal input 27 of the microprocessor 26. The microprocessor 26 is embodied for evaluating a change over time of signal components of the dc voltage signal and therefore of the output signal with the aid of a software program for example. An actuation of the proximity switch 4 is detected by the microprocessor 26 as a function of how quickly the signal components of the output signal, such as the height of the pulse peak or the pulse width for example, of successive clock periods change. That is to say if the signal components change within a predefined time of one second for example, this is detected as an actuation, while if the signal components change more slowly, there is no actuation present. By this means, the determination of an actuation of the proximity switch 4 is independent of the absolute value of the output signal, which eliminates long-term changes thereof, e.g. due to aging processes.

Figure 5:
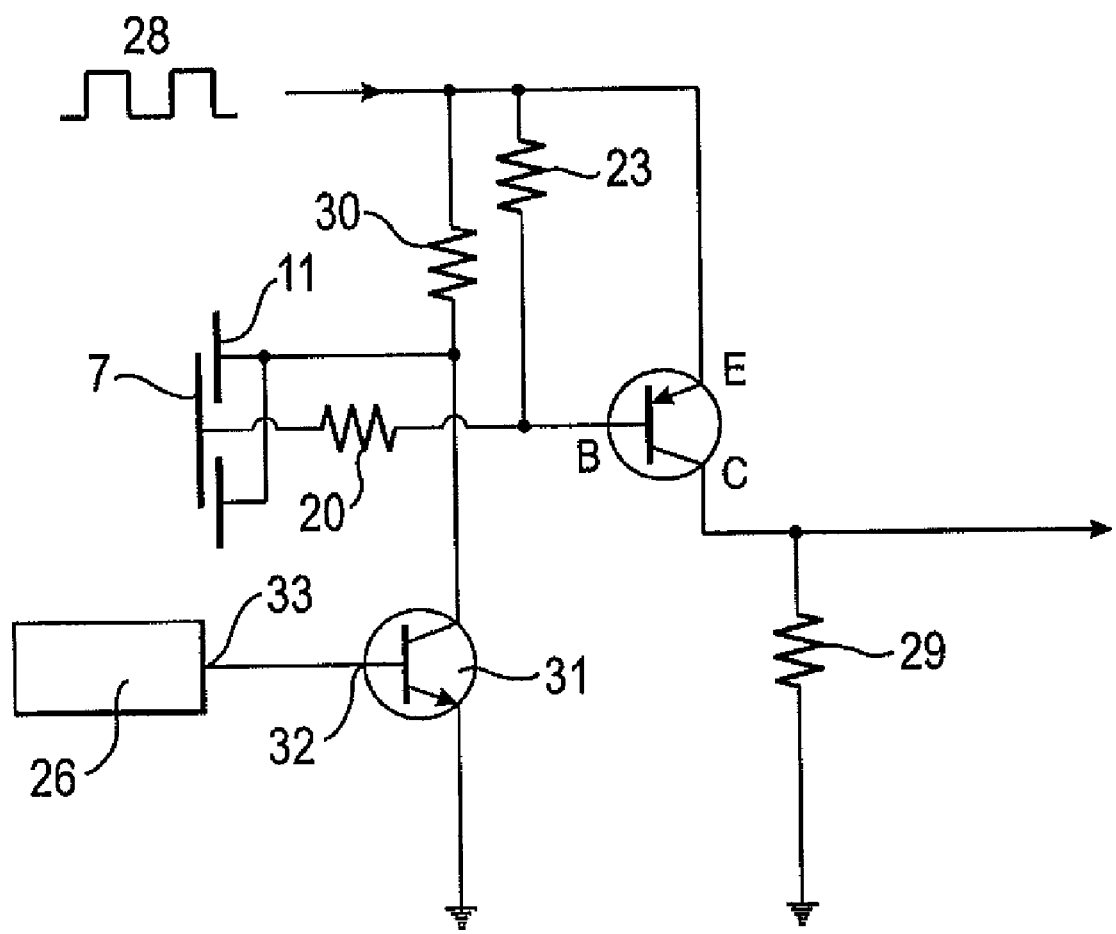
FIG. 5 shows a section of a schematic electrical circuit of the proximity switch according to the invention with active screening.
Figure 6:
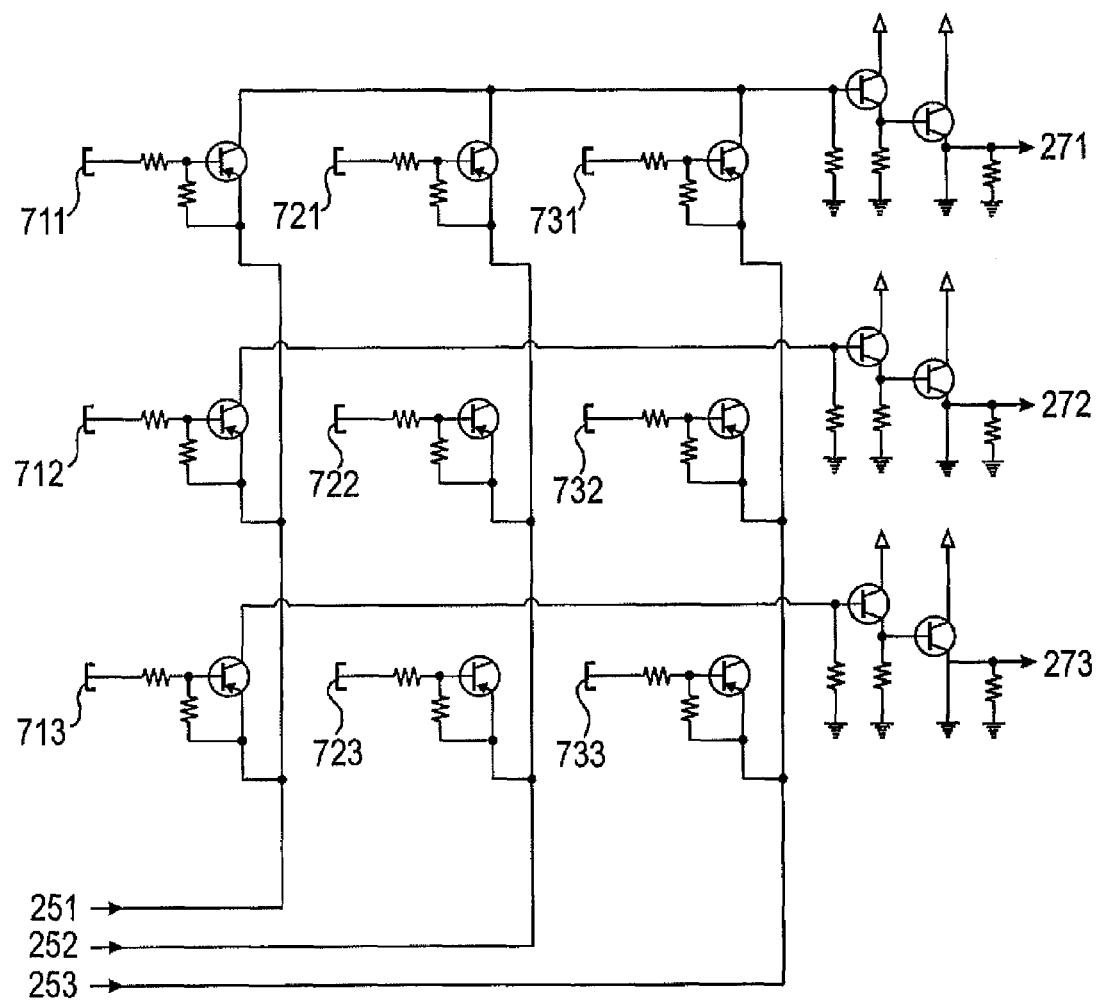
FIG. 6 shows a schematic circuit of the input field as shown in FIG. 1 with a plurality of proximity switches according to the invention connected in a matrix shape.

A section of the electrical circuit 14 of the proximity switch 4 according to the invention with active screening is shown in FIG. 5. The active screening is formed by the screening surface 11, which is connected to the signal input 21 of the semiconductor switch 18 by way of a low-impedance resistor 30, and at which, at the same time as at the sensor surface 7, the clock signal 28 is present by way of said low-impedance resistor 30. Suitable selection of the low-impedance resistor 30 makes it possible to match the shape of the clock signal 28 at the screening surface 11 to the shape of the clock signal 28 at the sensor surface 7 so that no difference in potential and therefore no shift of charge carriers occurs between the screening surface 11 and the sensor surface 7 and therefore the screening of the sensor surface 7 by the screening surface 11 against parasitic capacitances is ensured.

The screening surface 11 is connected to ground for the purposes of applying ground potential by way of a switch 31, which in the embodiment shown here is an NPN bipolar transistor. The switch 31 has a control signal input 32, specifically the base of the NPN bipolar transistor, which is connected to a control signal output 33 of the microprocessor 26. The switch 31 or the NPN bipolar transistor can therefore be switched in a simple manner by means of a software program of the microprocessor 26. For the purposes of function testing of the proximity switch 4, i.e. in order to ascertain a reference value of the output signal, the screening surface 11 is temporarily connected to ground potential by the switch 31, as a result of which the active screening is temporarily disabled and an actuation of the proximity switch 4 is simulated. By this means it is possible to check whether there is a sufficient swing of the output signal upon actuation of the proximity switch 4 or whether there is a malfunction, possibly due to contamination or wetting of the panel 2, due to ambient conditions such as temperature and humidity, or due to aging processes of the proximity switch 4. The swing of the output signal can possibly be adapted dynamically by changing the height of the clock signal 28, i.e. the proximity switch 4 can be calibrated automatically, which improves the functional reliability of the proximity switch 4. If, due to a contaminated panel 2 for example, reliable functioning of the proximity switch is no longer ensured, the household appliance 1 is automatically switched off.

The reference sensor surface 10 is connected in a corresponding manner to the sensor surface 7. The reference sensor surface 10 is arranged adjacent to the sensor surface 7 so that the capacitance of the reference sensor surface 10 or an open-type reference capacitor formed with the reference sensor surface 10 constitutes a measure for the ambient conditions, i.e. the parasitic capacitances, of the sensor surface 7, but also a measure for the influence of temperature, humidity, or changes in materials due to aging, on the output signal. The same clock signal 28 is present at the reference sensor surface 10 as at the sensor surface 7, in particular in a time-division multiplex method. That is to say the sensor surface 7 and the reference sensor surface 10 are supplied one after the other with different periods of the same clock signal 28. As an alternative thereto, a further clock signal from a further analog signal output of the microprocessor 26 can also be applied to the reference sensor surface 10. The reference signal generated by the reference sensor surface 10 is taken into account as the fundamental level of the output signal during the evaluation of the output signal that is generated by the sensor surface 7 in the microprocessor 26, and is therefore used for the determination of an actuation state of the proximity switch 4. In the case of household appliances 1 that are switched on with a power switch, it is established with the aid of the reference signal as early as during switching on whether there is an actuation of the proximity switch 4.

FIG. 6A shows a schematic circuit 14 of the input field 3, with nine proximity switches 4 according to the invention wired up in a three-by-three matrix shape, for the purposes of operating in a time-division multiplex method. The sensor surfaces 711, 712, 713 of the first three proximity switches are connected to a first signal output 251 of the microprocessor 26. The sensor surfaces 721, 722, and 723 of the second three proximity switches are connected to a second signal output 252 of the microprocessor 26. The sensor surfaces 731, 732, and 733 of the third three proximity switches are connected to a third signal output 253 of the microprocessor 26. The sensor surfaces 711, 721, and 731 are connected by way of their respectively associated semiconductor switch and a first sample and hold stage to a first signal input 271 of the microprocessor 26. The sensor surfaces 712, 722, and 732 are connected by way of their respectively associated semiconductor switch and a second sample and hold stage to a second signal input 272 of the microprocessor 26. The sensor surfaces 713, 723, and 733 are connected by way of their respectively associated semiconductor switch and a third sample and hold stage to a third signal input 273 of the microprocessor 26.

The clock signal 28 is output for a predefined time in each case, i.e. for a predefined number of clock periods, by one of the three signal outputs 251, 252, and 253 of the microprocessor 26. In this respect the signal outputs 251, 252, and 253 act in turn one after the other, which process is repeated on a cyclical basis. During the time in which the clock signal 28 is output by one of the three signal outputs 251, 252, and 253, all three signal inputs 271, 272, and 273 of the microprocessor 26 are evaluated in each case. By this means all nine sensor surfaces 711, 712, 713, 721, 722, 723, 731, 732, and 733 can be checked one after another with only one circuit to see whether there is an actuation of the corresponding proximity switch by a user.

Figure 7:
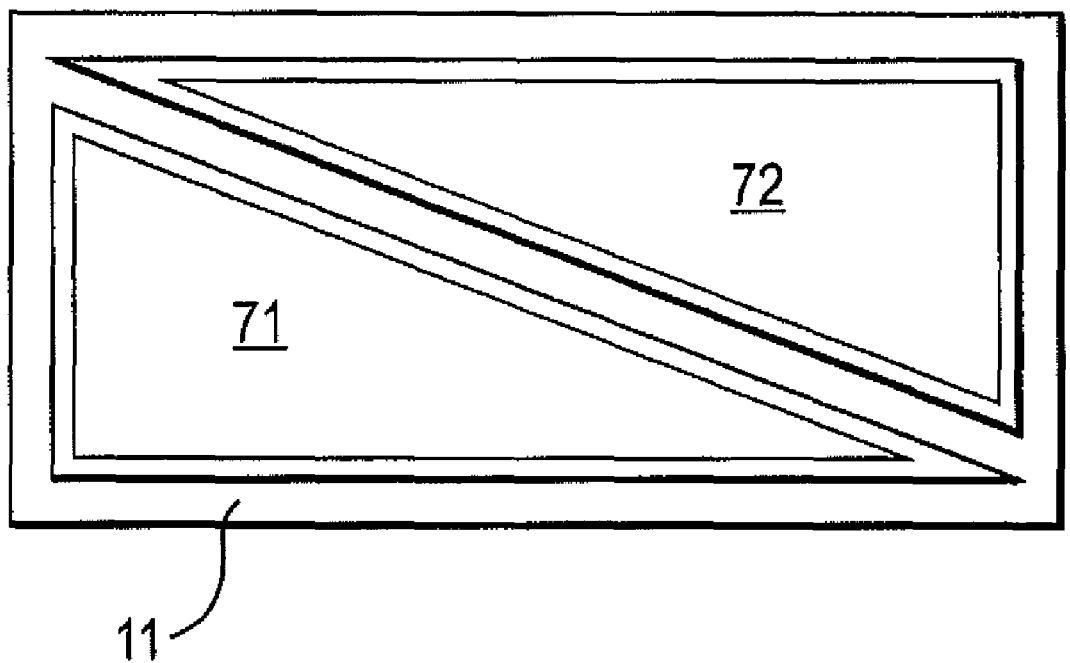
FIG. 7 shows, in a schematic front view, an embodiment of two sensor surfaces that form a position sensor.

An embodiment of two sensor surfaces 71 and 72, which together form a position sensor, is shown in a schematic front view in FIG. 7. The sensor surfaces 71 and 72 are embodied in the form of right-angled triangles and are arranged adjacent to each other on a common substrate 5 or on the rear side of the panel 2, the respective hypotenuse of the sensor surfaces 71 and 72 being situated opposite the other. The sensor surfaces 71 and 72 are bordered by a common screening surface 11, which extends along the hypotenuse of the triangles between the sensor surfaces 71, 72. As a function of the position relative to the lateral extent of the sensor surfaces 71, 72 at which an actuation is effected by the user, where the user touches the panel 2 in the area of the sensor surfaces 71, 72 and therefore of the position sensor, the capacitance of the capacitors formed with the sensor surfaces 71, 72 is different due to the triangular shape of the sensor surfaces 71, 72. The position of the actuation can therefore be determined on the basis of the output signals associated with the sensor surfaces 71, 72 and therefore a switching state corresponding to or allocated to this position can be triggered. In the case of a change or shift in the actuation position, where the user shifts his finger on the panel 2 for example, this change is likewise detected and where relevant a switching state corresponding to the new position is triggered. In this way the position sensor forms a sliding switch without elements that have to be shifted mechanically, by means of which, for example, a temperature or an output in the case of a cooker hob, an air-conditioning appliance or a refrigeration appliance can be set.

Figure 8:
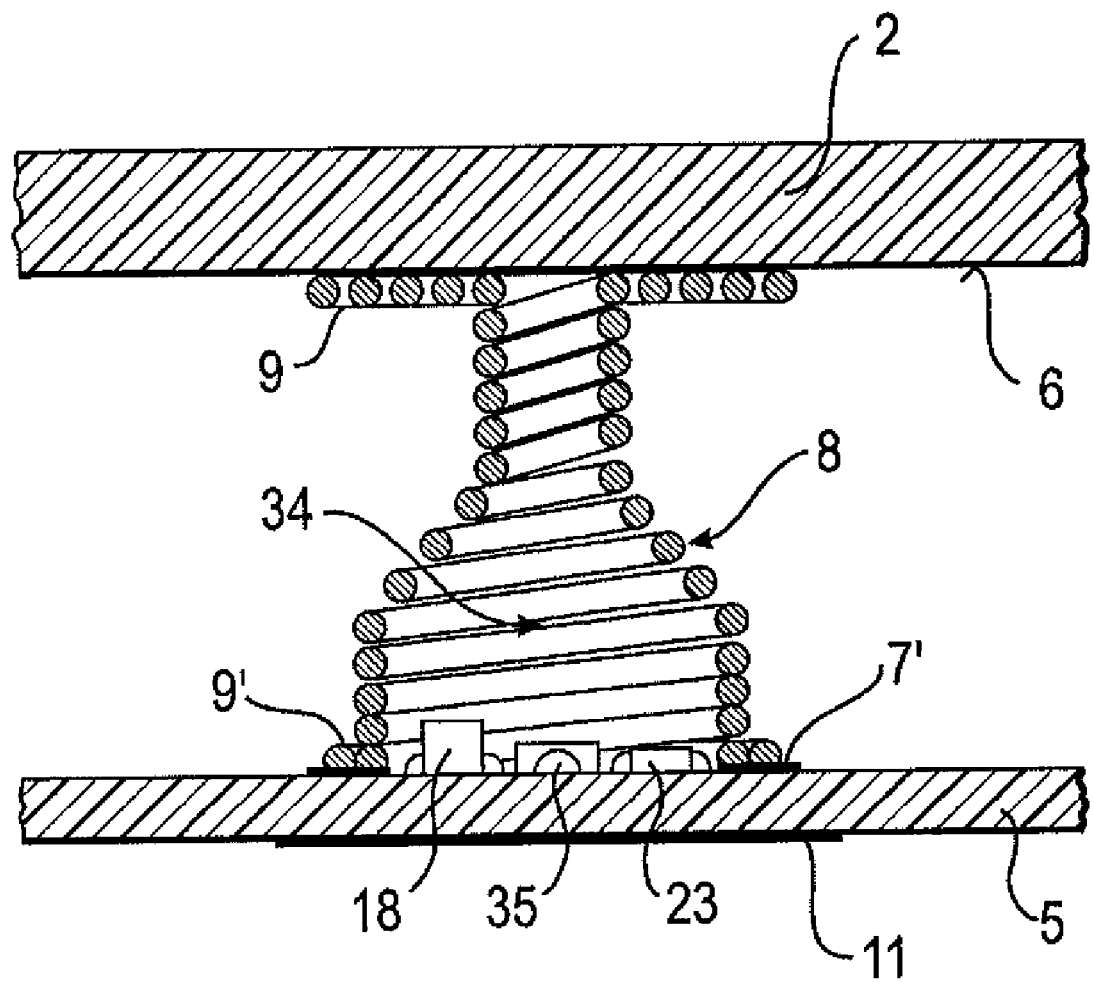
FIG. 8 shows, in a schematic side view, a section of the input field as shown in FIG. 1 with electronic components of the electrical circuit as shown in FIG. 4 that protrude into a cavity enclosed by a compression spring.

A section of the input field as shown in FIG. 1 is shown in a schematic sectional view in FIG. 8. A solder ring 7' is applied to the printed circuit board 5 with which the winding disk 9' formed by the lower two windings of the wound compression spring 8 is soldered to the printed circuit board 5 and by this means connected to the electrical circuit 14. The compression spring 8 encloses a cavity 34 with its windings. On the printed circuit board 5, the PNP bipolar transistor of the semiconductor switch 18, with its base-emitter resistor 23 and its current-limiting resistor 20, and also a light-emitting diode 35 are arranged within the solder ring 7' on the side of the electronic components of the electrical circuit 14 facing the cover plate 2, and protrude into the cavity 34 enclosed by the compression spring 8. In order to enable an electrical connection of these electronic components to the further components of the electrical circuit 14, the solder ring 7' is not an entirely closed ring but instead is interrupted at the side (not shown). As an alternative thereto, the electrical connection can also be effected through the printed circuit board 5. Together with the screening surface 11 arranged on the rear side of the printed circuit board 5, the compression spring 8 forms a Faraday cage for the electronic components arranged in the inner area 34 of the compression spring 8 so that the said components are screened against electromagnetic fields from the environment.

LIST OF REFERENCE SYMBOLS

1 Household appliance
2 Panel
3 Input field
4 Proximity switch
5 Printed circuit board
6 Rear side of the panel
7 Sensor surface
7' Solder ring
8 Compression spring
9 Winding disk for the upper windings
9' Winding disk for the lower windings
10 Reference sensor surface
11 Screening surface
12 Electronic module
13 Printed wiring board
14 Circuit of the proximity switch
15 Power electronics
16 Finger of the user
17 Capacitor
18 Semiconductor switch
19 Control input of the semiconductor switch
20 Current-limiting resistor
21 Signal input of the semiconductor switch
22 Signal output of the semiconductor switch
23 Base-emitter resistor
24 Sample and hold stage
25 Analog signal output of the microprocessor
26 Microprocessor
27 Analog signal input of the microprocessor
28 Clock signal
29 Resistor
30 Low-impedance resistor
31 Switch
32 Control signal input of the switch
33 Control signal output of the microprocessor
34 Cavity enclosed by the compression spring
35 Light-emitting diode

The invention claimed is:

1. A capacitive proximity switch, comprising:
   an electrically insulating cover plate having a front surface;
   an electrically conductive sensor surface covered by said cover plate, said sensor surface serving as a part of a capacitor having a capacitance that varies with proximity;
   a reference sensor surface for generating a reference signal for a determination of an actuation state of the proximity switch, wherein signal components of a reference signal are proportional to a capacitance of a reference capacitor formed with said reference sensor surface, and wherein the capacitance of the reference capacitor is determined by ambient conditions at said sensor surface;
   a common substrate disposed at a spacing distance from said cover plate and carrying said reference sensor surface and said sensor surface in common;
   an electrically conductive body disposed between said cover plate and said substrate, spanning said spacing distance between said substrate and said cover plate, and being electrically connected to said sensor surface and/or forming at least a part of said sensor surface with a portion of a surface thereof;

wherein said reference sensor surface is insulated against electrical charges and/or changes in a charge at said front side of said cover plate by an air layer formed by said spacing distance between said substrate and said cover plate.

2. The proximity switch according to claim 1, wherein said reference sensor surface and said sensor surface are commonly disposed on the same side of said substrate.

3. The proximity switch according to claim 1, wherein said sensor surface is connected to receive a given clock signal and said reference sensor surface is connected to receive a further clock signal or the given clock signal.

4. The proximity switch according to claim 1, wherein said sensor surface and said reference sensor surface are connected to receive a clock signal in a time-division multiplex method.

5. The proximity switch according to claim 1, wherein at least one electronic component is disposed on said substrate, protruding into a cavity enclosed by said electrically conductive body.

6. The proximity switch according to claim 5, wherein said electronic component is at least one component selected from the group consisting of a semiconductor switch and a light-emitting element.

7. The proximity switch according to claim 5, wherein said electrically conductive body is a compression spring wound out of an elongated body.

8. An input field for a household appliance, comprising at least one proximity switch according to claim 1.

9. The input field according to claim 8, wherein said sensor surface is one of a plurality of sensor surfaces wired in a matrix shape for operating in a multiplex method.

10. The input field according to claim 8, wherein at least two said sensor surfaces are disposed adjacent one another and together forming a position sensor.

11. A household appliance, comprising an input field formed with at least one proximity switch according to claim 1.

* * * * *